Figure 1:
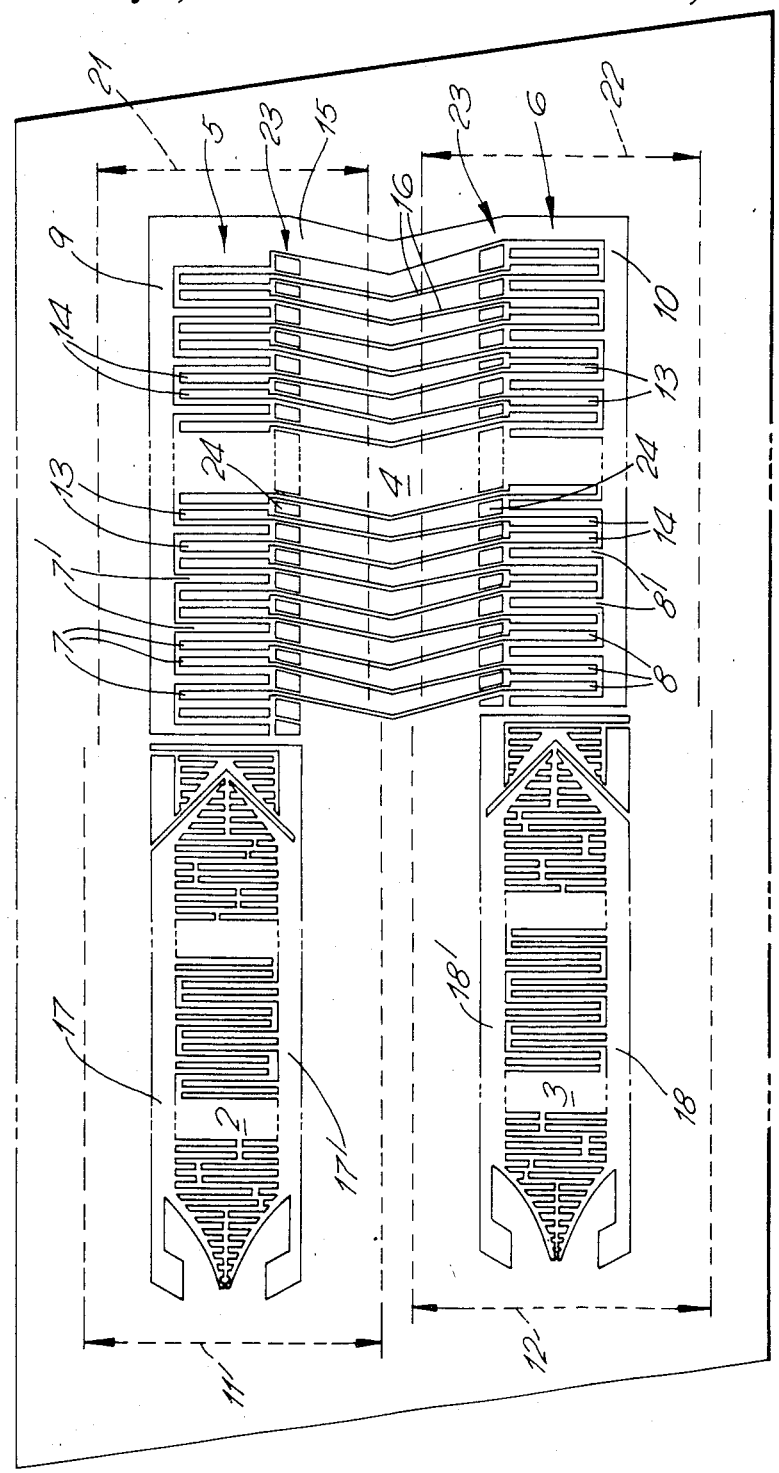

United States Patent [19]

Schofield

[11] Patent Number: 4,663,554
[45] Date of Patent: May 5, 1987

[54] SURFACE ACOUSTIC WAVE DEVICE

[75] Inventor: John Schofield, Coulsdon, England

[73] Assignee: U.S. Philips Corporation, New York, N.Y.

[21] Appl. No.: 738,196

[22] Filed: May 24, 1985

[30] Foreign Application Priority Data

May 31, 1984 [GB] United Kingdom ............... 8413867

[51] Int. Cl.⁴ .......................................... H01L 41/08
[52] U.S. Cl. ............................. 310/313 D; 333/153; 333/195
[58] Field of Search ........... 310/313 R, 313 B, 313 C, 310/313 D; 333/150–155, 193–196

[56] References Cited

U.S. PATENT DOCUMENTS 4,365,220 12/1982 Hikita ............................. 333/154 X
4,510,471 4/1985 Flinn et al. ..................... 333/153 X
4,511,867 4/1985 Schofield .................... 310/313 D X Primary Examiner—Mark O. Budd
Attorney, Agent, or Firm—Robert T. Mayer; Bernard Franzblau

[57] ABSTRACT

In a surface acoustic wave device including launching and receiving transducers (2, 3) and a reflective multistrip coupler (4), the inner boundaries of the input and output electrode arrays (5, 6) of the reflective coupler (4) are defined both electrically and acoustically by an electrically discontinuous strip (23) formed for example by isolated islands of metalization (24) in conjunction with corresponding adjacent portions of interconnecting conductors (16). This enables the effective apertures of the input and output arrays (5, 6) to be better matched to the transducers (2, 3). The arrangement can reduce the insertion loss in low-loss SAW devices (i.e. in which both ends of the transducers (2, 3) are coupled via corresponding reflective couplers (4)) and also in single symmetrical guided mode SAW devices in which the strip 23 can provide an effective inner guiding bus bar whose surface mass loading corresponds to that of the outer bus bars (9, 10).

7 Claims, 4 Drawing Figures

SURFACE ACOUSTIC WAVE DEVICE

This invention relates to a surface acoustic wave bandpass electrical filter device including a piezoelectric substrate able to propagate acoustic waves at a surface thereof, input transducing means arranged to launch acoustic wave energy along a first propagation track at said surface, output transducing means arranged adjacent to one side of the input transducing means to receive acoustic wave energy from a second propagation track at said surface which is substantially parallel to but does not overlap said first track, and electrical reflective multistrip coupling means arranged correspondingly to receive acoustic wave energy from the input transducing means in the first track and to relaunch at least part of that energy as acoustic wave energy back towards the output transducing means in the second track in which said input and output transducers are formed by respective interdigital electrode arrays each comprising parallel strip electrodes which are respectively connected to a corresponding one or other of a pair of conductive strips which form respective bus bars extending along the corresponding sides of the interdigital electrode array, and in which the reflective multistrip coupling means comprise a first and a second array of mutually parallel conductive strips arranged respectively across the first and second tracks, each array consisting of a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array, and the second set of strips in both arrays being connected together. Such a device will be referred to herein as a surface acoustic wave device of the kind specified.

A surface acoustic wave device of the kind specified, has been described in EP-A-O No. 098 661. The process of track-changing is commonly employed in surface acoustic wave filters in order to reduce the transfer of energy from the launching to the receiving transducer by means of various bulk acoustic wave modes which are themselves also launched and received by the type of interdigital transducer normally employed, and which have propagation velocities which differ, in some cases only slightly, from the propagation velocity of the desired surface acoustic wave. The form of reflective multistrip coupler described in the above sentioned EP-A-O No. 098 661 is compact and potentially efficient, and enables the input and output transducers to be sounted side by side thus reducing the overall length of a narrow band device and enabling a smaller area of substrate material to be used for each device especially at lower frequencies in the range, for example, of from 10 MHz to 60 MHz.

In a further effort to reduce the amount of substrate material, it has been proposed in EP-A-O No. 106 384, to employ interdigital input and output transducer arrays which will only propagate and transduce a single acoustic-surface-wave-guided-energy mode which is symmetrical about the central propagation axis of the array. In this type of transducer the overall width of the interdigital electrode array, including bus bars, will only be a few acoustic wavelengths, e.g. for Y-cut and Z-propagating or 124° to 131° rotated Y-cut X-propagating lithium niobate the width could be $3\lambda_c$ to $3.5\lambda_c$, but could be increased to not greater than $5\lambda_c$ if the interdigital array is made symmetrical about the central axis, where $\lambda_c$ is the acoustic wavelength at the centre frequency $f_c$ of the passband of the device. In this propagation mode the acoustic energy is not strictly contained within the transducer array but tends to fall away transversely and outwardly in an exponential manner from a significant magnitude at the outer edges of the bus bars.

When single guided mode transducers are employed in conjunction with a reflective multistrip coupler, the input and output arrays of strip electrodes are arranged correspondingly to maintain the single guided mode of propagation for the acoustic energy in the corresponding propagation track to the best possible extent.

In general the acoustic wave energy propagation track relating to the transducers must be matched in width as closely as possible to the corresponding effective track relating to the input and output arrays of the reflective multistrip coupler because any mismatch will tend to occur both at the input and at the output of the coupler and the effects will combine multiplicatively to give rise to a substantial increase in insertion loss for an apparently small amount of individual mismatch. This effect tends to be more significant in the case of a reflective multistrip coupler when employed in a single guided-energy mode device because of the indeterminate inner boundary to the propagation track resulting from the presence of the interconnecting conductor portions leading from the first set of electrode strips forming a coupler array.

It is an object of the invention to provide an improved surface acoustic wave device of the kind specified and in which losses due to mismatch between the effective apertures of a transducer and a reflective multistrip coupler can be reduced in such a device as, for example, a device using a single guided mode of propagation of surface acoustic waves.

According to the invention there is provided a surface acoustic wave device of the kind specified in which the strips constituting the second set in each array of the reflective multistrip coupling means, are interconnected by means of a respective conductive strip forming a corresponding bus bar extending along the outer boundary of the array, characterized in that an electrically discontinuous boundary-defining strip is provided along the inner boundary of each array of the refletive multistrip coupler, so as to provide an inner boundary whose confining effect on surface acoustic wave energy propagating along that array substantially corresponds to that provided by the bus bar extending along the outer boundary.

The electrically discontinuous boundary-defining strip should provide an amount of mass loading of the surface which substantially corresponds to that provided by the outer bus bar. However, the strip must be formed of a material which has a correspondingly low acoustic absorption loss factor which is characteristic of the metal outer bus bar, otherwise acoustic energy will be absorbed at the loaded boundary and will tend to be deflected towards the boundary and to be removed in this manner from the flow of energy along the array track. This effect will be especially significant in the case of a device employing the single symmetrical guided energy mode which depends for its propagation along the array on reflection at the boundaries, and would therefore be rapidly attenuated by a boundary loading material having a significant loss factor.

The electrically discontinuous boundary-defining strips therefore preferably each comprise a plurality of individual metal layer island regions linearly distributed in alternation with associated adjacent portions of interconnecting conductors which interconnect corresponding strips from the respective first sets of the two arrays of the coupler. The strips forming the second set of an array can be extended so that they form part of the corresponding boundary-defining strip. When the arrays forming the input and output transducers and the reflective multistrip coupler, are arranged to propagate and transduce a single symmetrical surface-acoustic-wave guided-propagation mode, the boundary-defining strip functions as a loading strip for the surface of the wafer with respect to surface acoustic wave energy propagating thereat. The aim when using the single guided mode is to cause the electrically discontinuous boundary-defining metal strip pattern formed by the metal island regions and adjacent conductor regions, to apply an average acoustic loading to the surface of the wafer which is substantially the sase as that provided by the outer bus bar of the coupler array.

The invention is based on the realisation that some part of a hitherto unexplained amount of the insertion loss in a device of the kind specified, is due a spreading out of the flow of acoustic energy along the first and second arrays of the reflective multistrip couplers into the intermediate region between the propagation tracks associated with the input and output transducers, and that this undesired loss of acoustic energy can be reduced by arranging a boundary-defining strip along the inner boundary of each array, which is electrically discontinuous so that the interconnecting conductors between the two arrays do not have to cross a continuous bus bar and be insulated therefrom, a process which is expensive to manufacture and would undesirably increase the capacitances involved. The use of a discontinuous metal pattern including the relevant parts of the interconnecting conductors can provide an inner boundary which can, in various ways herein described, be made to approach an electrical equivalence to the outer bus bar. By making the interconnecting conductors narrower than the strip electrodes of the array and by suitably spacing their connections with the strips, the re-launching of acoustic energy which can otherwise occur near the boundary of the array due to the interconnecting conductors initially having the spacing of the strip electrodes of the array, can be significantly reduced, and this loss can be reduced even further by the presence of intermediate metalised regions.

The bouhdary-defining strip will also acoustically load the surface of the wafer in a manner similar to that effected by the outer bus bar. Thus it was further realised that the acoustic loading of the inner boundary in substantially the same manner as that in which the outer bus bar loads the outer boundary of each array, could effectively reduce the inward spread of acoustic energy when the device is operating in the single symmetrical U guided mode.

Embodiments of the invention will now be described by way of example, with reference to the accompanying drawings, of which:-

Figure 2:
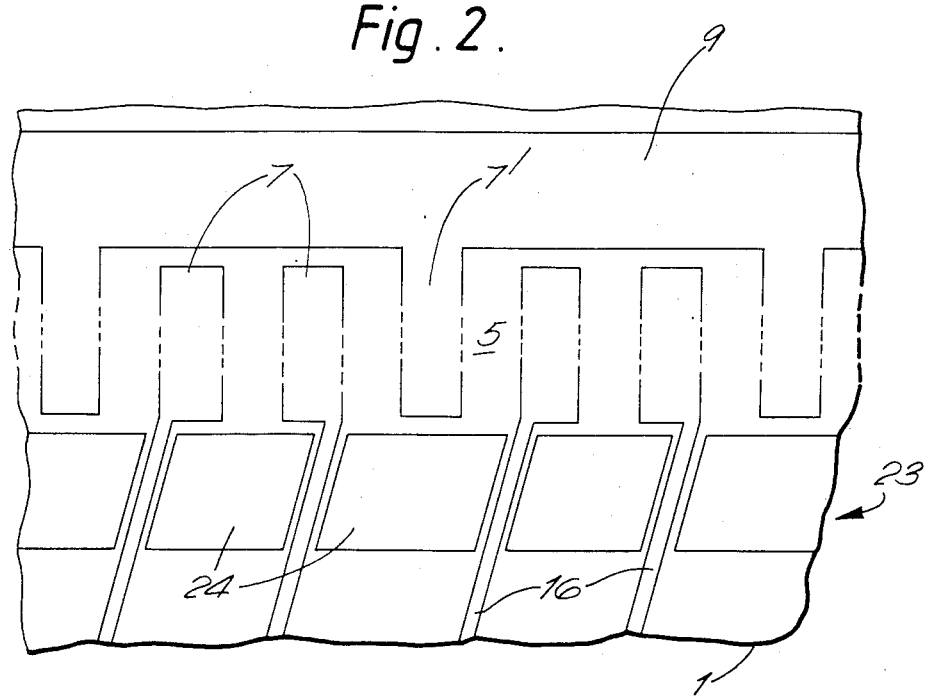
Figure 3:
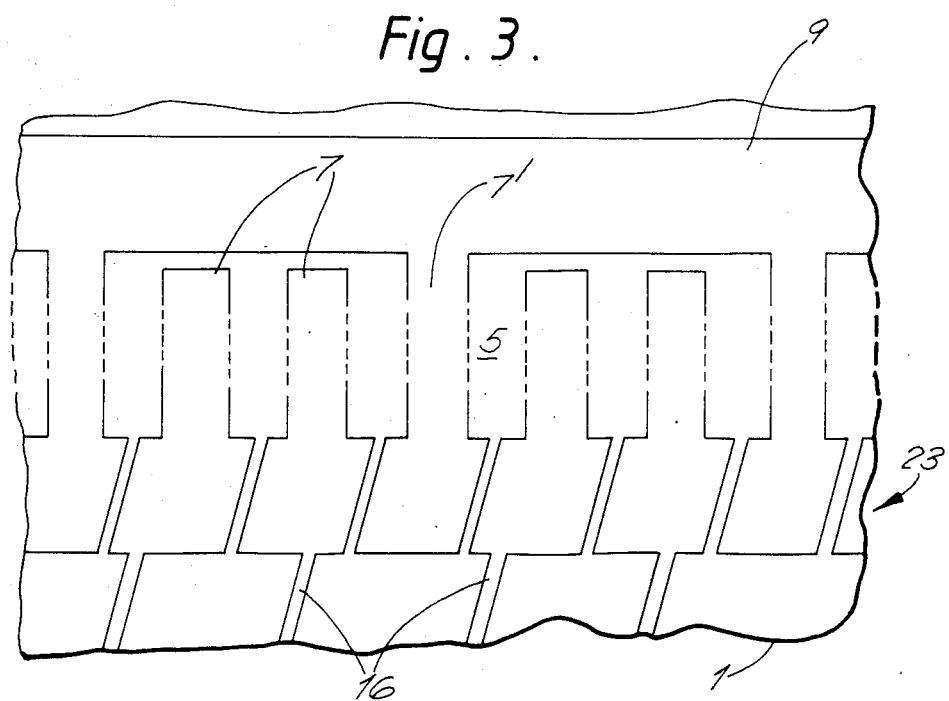
Figure 4:
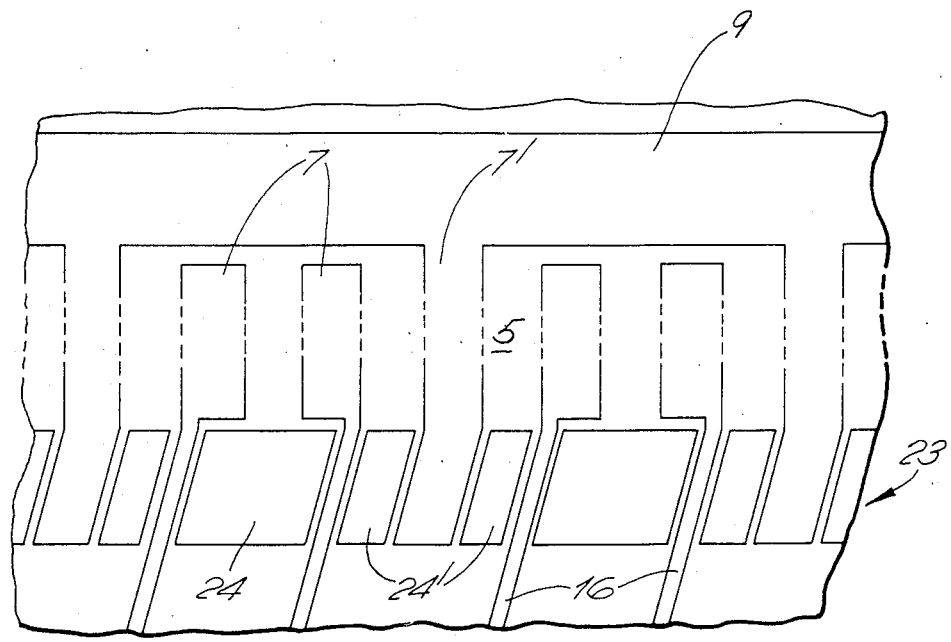

FIG. 1 illustrates a surface acoustic wave device in accordance with the invention, FIG. 2 is an enlarged detail of FIG. 1, FIG. 3 is an enlarged detail illustrating a modified form of the device of FIG. 1, and FIG. 4 is an enlarged detail illustrating a further modification of the device shown in FIG. 1.

Referring to the drawings, FIG. 1 shows a surface acoustic wave bandpass electrical filter embodying the invention. A piezoelectric substrate 1 is provided with a major surface suitable for the propagation of surface acoustic waves. Input transducing means in the form of an interdigital electrode array 2 is arranged on said surface so as to launch acoustic wave energy along a first propagation track 11 at said surface. Output transducing means in the form of a further interdigital electrode array 3 is arranged on said surface adjacent to one side of the input transducing array 2, so as to receive acoustic wave energy from a second propagation track 12 at said surface, which is parallel to, but does not overlap the first track 11. Electrical reflective coupling means in the form of a reflective multistrip coupler 4 is arranged on said surface so as to receive acoustic wave energy from the input transducing array 2 via the first track 11 and to relaunch at least part of that energy as acoustic wave energy back towards the output transducing array 3 via the second track 12.

The reflective multistrip coupler 4 comprises a first array 5 of mutually parallel conducting strips 7, 7' arranged across an input propagation track 21, and a second array 6 of mutually parallel conducting strips 8, 8' arranged across an output propagation track 22. Each array 5, 6 consists of a respective first set of mutually insulated alternately widely and closely spaced strips 7, 8 and a second set of strips 7', 8', which latter are electrically interconnected by a peripheral bus-bar 9, 10. One U of the strips 7', 8', of the second set is situated between each widely spaced pair 13 of the strips 7, 8, forming the first set of each array 5, 6. Each strip 7 forming a widely spaced pair 13 in the first set of one array, is respectively connected to a corresponding strip 8 forming a closely spaced pair 14 in the first set of the array by means of a corresponding interconnecting strip 16. The bus bars 9, 10, interconnecting the strips 7', 8', forming the second sets of the respective arrays 5, 6, are connected together by an interconnecting bus bar portion 15. The strips 7,7', or 8,8', are uniformly spaced by $\lambda/3$ at the centre frequency of the passband.

In the present embodiment the interdigital input and output transducer arrays 2, 3, are both apodised, and are dimensioned transversely to the propagation direction so that each will only propagate and transduce a single surface-acoustic-wave guided-energy mode which is symmetrical about the central propagation axis of the array, as described in EP-A-O No. 106 384. Thus, for example, when using a Y-cut Z-propagating monocrystalline wafer of lithium niobate as the substrate 1, the overall width of the transducer arrays 2, 3, including that of connecting bus bars 17, 17', 18, 18', is approximately $3\lambda_c$, where $\lambda_c$ is the wavelength of a surface acoustic wave at the centre frequency $f_c$ of the fundamental passband of the filter.

It is a property of said single guided-energy mode that the propagating acoustic energy is not confined within the bus bars but extends as a flow parallel to the propagation direction some distance to either side of the array with a magnitude which falls away exponentially beyond the outer edges of the bus bars 17, 17', 18, 18'. For this reason the acoustic energy propagation tracks 11 and 12 associated with the transducers 2, 3, are shown to be about twice the overall width of the transducer arrays.

The guided acoustic energy mode propagates along the transducer array in accordance with waveguide theory by the superposition of synchronised intersecting acoustic surface wavefronts reflected at or near the outer boundaries of the bus bars 17, 17', 18, 18'. As a consequence of this the guided acoustic surface wave mode will propagate along the array with a phase velocity greater than the normal surface wave propagation velocity in a normal wide-aperture array, namely an array whose acoustic energy aperture is greater than about 10$\lambda$ and usually from 20$\lambda$ to 100$\lambda$. However, in the guided mode, the acoustic energy will only travel along the array at the group velocity which will be less than the normal (free propagation) velocity. The interdigital arrays 2 and 3 in FIG. 1 conventionally employ double electrodes having a centre to centre spacing of $\lambda_c/4$ and an electrode width of $\lambda_c/8$, however, the electrode width and spacing must correspond to the phase velocity of the guided mode and $\lambda_c$ is the wavelength of the phase pattern.

The apodisation of the transducer arrays 2, 3, on the other hand, must be related to the impulse response of the filter and hence to the mechanism of energy flow in the device. Thus the amount of overlap of adjacent pairs of oppositely poled electrodes must be distributed along the array with reference to the group velocity of the guided mode.

In order to maintain a maximum transfer of acoustic energy from the input transducer 2 to the first array of strips 5 of the reflective coupler 4, the lengths of the electrodes 7 and 7' and the width and location of the peripheral bus bar 9 are arranged so that the single symmetrical guided mode in the transducer array 2 continues to propagate along the first array 5, i.e. the strips 7, 7', must have a uniform centre-to-centre spacing of $\lambda_c/3$, where $\lambda_c$ is the wavelength of the phase pattern at the passband centre frequency $f_c$. In the form of reflective multistrip coupler described in the EP-A-O No. 098 661, the inner edge of the propagation path for acoustic energy through the array 2, is ill-defined with the result that acoustic energy would tend to spread out into the interconnecting region thus increasing the insertion loss, and similar considerations would also apply to the propagation of relaunched acoustic energy along the second array of strips 6 towards the output transducer 3.

This difficulty is substantially reduced in accordance with the invention, by providing an electrically discontinuous boundary-defining and loading strip 23 along the inner boundary of each array 5, 6, of the reflective multistrip coupler 4, so as to provide a surface loading which substantially corresponds to that provided by the bus bar 9, 10, extending along each corresponding outer boundary. In the embodiment of FIG. 1, illustrated in enlarged detail in FIG. 2, the electrically discontinuous boundary-defining and loading strip 23 comprises a linear arrangement of electrically isolated regions 24 of the applied metal pattern located between adjacent interconnecting strips 16 together with the immediately adjacent portions of the interconnecting strips themselves.

The gap between the isolated regions 24 and the adjacent strips 16 should be made as small as possible consistent with the achievement in practice of a consistently high degree of electrical isolation therebetween when using normal manufacturing processes. In this way the discontinuous strip formed thereby can be made to provide almost the same loading effect as the bus bar 9, 10, and thereby to define more clearly the inner boundary of the respective array 5, 6, forming the acoustic surface waveguiding structure relating to the corresponding propagation track 21, 22.

The centres of the interconnecting strips 16 are spaced apart by a distance different from the centre to centre spacing of the strips 7, 8, to which they are respectively connected so that as small an amount as possible of the electrical energy flowing from the strips 7 to the strips 8 via the corresponding conductors 16, is dissipated in launching acoustic wave energy in the intermediate region occupied by the strips 16. The strips 16 are also inclined relative to the direction at right angles to the propagation direction in the tracks 21, 22, in a manner similar to that described in EP-A-O No. 103 932, in order to avoid transferring a significant amount of acoustic energy directly from the input track 21 to the output track 22 by acoustic reflection from the connecting strips 16 which are spaced approximately $\lambda_c/2$ apart, since the energy thus transferred will not have the same impulse delay characteristic as the signal transduced by the coupler and will have undesirable effects on the transfer characteristics of the device.

Preferably the boundaries between the isolated conducting regions 24 and the adjacent portions of the strips 16 are also inclined to the direction transverse to the propagation direction in the corresponding track 21, 22, so as to reduce the effect of direct acoustic reflection along the track from this cause.

FIG. 3 is a detail illustrating an alternative conductor pattern which can be employed in accordance with the invention to provide an electrically discontinuous loading strip 23 along the inner boundary of each array 5, 6, of the reflective coupler 4. In this alternative no isolated conductor regions are employed but the areas of metallisation forming the strip electrodes 7, 7', and the conductors 16, are locally extended to form an electrically discontinuous strip-like region along the inner boundary which provides substantially the same acoustic loading as the outer bus bar 9. This arrangement, however, may tend to generate distorting fields at the adjacent boundaries of the extended portions and could be less satisfactory than the arrangement of FIG. 2 although the potential at the strips 7' connected to the outer bus bar 9 would be more clearly defined along the inner boundary.

FIG. 4 illustrates how the potential of the outer bus bar 9 can alternatively be introduced to the inner boundary by a modification of the arrangement of FIG. 2 in which the electrodes 7' are extended into the inner loaded boundary region 23 but are separated from the adjacent interconnecting strips 16 by isolated metal islands 24'.

It should be understood that in order to provide a maximum reflective transfer of acoustic energy from the input array 5 to the output array 6 of the coupler 4, each array 5, 6, must have a length amounting to about 100$\lambda$ on the aforementioned cut of lithium niobate, the apodised transducers 2, 3, also being of a similar length. It is therefore only possible to show a small part of the corresponding electrode patterns in FIG. 1. Furthermore, the substrate 1 would normally be more extensive relative to the device electrode pattern than is indicated in FIG. 1 and would in practice be proportioned so as to be suitable to handle, to mount and to use without significant risk of breakage, especially in the case of operation at higher frequencies of the order of 200 MHz and above, when the device pattern may occupy only a small proportion of the surface of the finished wafer.

Following normal surface acoustic wave practice, attenuating medium such as wax, would be applied around the periphery of the wafer surface to attenuate unwanted reflections from the edges of the wafer, especially to the left of the transducers 2, 3, and to the right of the reflective coupler 4 as shown in FIG. 1. However, care must be exercised to ensure that none of the attenuating medium is present within the tracks 11, 12, 21, 22, in the path of the desired acoustic waves.

The description has been directed up to now, to a device employing a single symmetrical guided mode of propagation, and for this reason FIG. 1 shows a considerable separation of the input and output arrays 2 and 3 because of the spread of acoustic energy well beyond the guiding boundaries formed by the bus bars in this propagation mode. However, the invention can also be usefully employed in a surface acoustic wave device employing conventional wide aperture arrays with a maximum electrode overlap greater than about $6\lambda_c$ and usually in the range $20\lambda_c$ to $100\lambda c$, again in order to define the inner boundaries of the input and output tracks of the reflective coupler so that they can be matched in width more accurately to the corresponding widths of the effective propagation tracks associated with the input and output transducers. In this case the metal loading pattern defines more precisely the electrical field conditions at the boundary and renders more abrupt the transition between the arrays 5, 6 of electrodes 7, 7', 8, 8', and the interconnecting electrodes 16 which are spaced so as to be inactive and unresponsive with respect to the surface acoustic waves propagating along the arrays 5 and 6.

The reduction in the insertion loss resulting from the improved definition of the inner boundaries of the coupler arrays 5, 6, in accordance with the invention, is also advantageously applicable to the form of so-called low-loss surface acoustic wave device in which surface acoustic wave energy launched from both ends of the input transducer, is coupled via respective reflective multistrip couplers of the kind specified, to corresponding ends of the output transducer in reinforcing transductive relationship. Such low-loss surface acoustic wave devices have been proposed for use at low signal levels in the input stages of receivers and amplifiers to provide an improvement in signal to noise ratio, and have also been proposed for use as a diplexer in the antenna feed circuits of mobile or portable transceivers in which as much of the transmitter power as possible has to be transferred to the antenna in order to minimise the unit size and electrical consumption for a given effective radiated power, e.g. for cellular radio.

I claim:

1. A surface acoustic wave bandpass electrical filter device comprising: a piezoelectric substrate able to propagate acoustic waves at a surface thereof, input transducing means arranged to launch acoustic wave energy along a first propagation track at said surface, output transducing means arranged adjacent to one side of the input transducing means to receive acoustic wave energy from a second propagation track at said surface which is substantially parallel to but does not overlap said first track, and electrical reflective multistrip coupling means arranged correspondingly to receive acoustic wave energy from the input transducing means in the first track and to relaunch at least part of that energy as acoustic wave energy back towards the output transducing means in the second track, said input and output transducing means being formed by respective interdigital electrode arrays each comprising parallel strip electrodes which are respectively connected to a corresponding one or other of a pair of conductive strips which form respective bus bars extending along the corresponding sides of the interdigital electrode array, and in which the reflective multistrip coupling means comprise a first and second array of mutually parallel conductive strips arranged respectively across the first and second tracks, each array comprising a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array, the second set of strips in both arrays being connected together, and in which the strips constituting said second set in each array of the reflective multistrip coupling means are interconnected by means of a respective bus bar extending along the outer boundary of the array, characterized in that an electrically discontinuous boundary-defining strip is provided along the inner boundary of each array of the reflective multistrip coupler, so as to provide an inner boundary whose confining effect on surface acoustic wave energy propagating along that array substantially corresponds to that provided by the bus bar extending along the outer boundary.

2. A device as claimed in claim 1, characterised in that each said electrically discontinuous boundary-defining strip comprises a plurality of individual electrically conductive island regions linearly distributed in alternation with associated adjacent portions of interconnecting conductors which interconnect corresponding strips from the respective first sets of the two arrays.

3. A device as claimed in claim 2, characterised in that said island regions are electrically isolated portions of metal layer.

4. A device as claimed in claim 3, characterised in that the conducting strips forming the second set in an array are extended towards the inner boundary to form part of the corresponding electrically discontinuous boundary-defining strips.

5. A device as claimed in claim 1 wherein the electrode arrays which form the input and output transducing means, and the reflective multistrip coupler are arranged to propagate and transduce a single symmetrical acoustic surface wave guided energy propagation mode.

6. A device as claimed in claim 2 wherein the conducting strips forming the second set in an array extend towards the inner boundary to form part of the corresponding electrically discontinuous boundary-defining strips.

7. A device as claimed in claim 2 wherein the electrode arrays which form the input and output transducing means, and the reflective multistrip coupler are arranged to propagate and transduce a single symmetrical acoustic surface wave guided energy propagation mode.

* * * * *